(12) United States Patent
Lin

(10) Patent No.: US 6,521,910 B1
(45) Date of Patent: Feb. 18, 2003

(54) STRUCTURE OF A TEST KEY FOR MONITORING SALICIDE RESIDUE

(75) Inventor: Cheng-Nan Lin, Taichung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/682,946

(22) Filed: Nov. 2, 2001

(51) Int. Cl.⁷ .............................................. H01L 21/336
(52) U.S. Cl. ............................. 257/48; 438/11; 438/14; 438/15; 438/18
(58) Field of Search ...................... 257/48; 438/11, 438/14, 15, 18

(56) References Cited

U.S. PATENT DOCUMENTS

| | | | | |
|---|---|---|---|---|
| 5,051,690 A | * | 9/1991 | Maly et al. ..................... 257/48 |
| 5,889,410 A | * | 3/1999 | El-Kareh et al. ............. 257/48 |
| 5,949,090 A | * | 9/1999 | Iwasa et al. ................... 257/48 |
| 5,952,674 A | * | 9/1999 | Edelstein et al. ............. 257/48 |
| 5,956,566 A | * | 9/1999 | Lin et al. ....................... 257/48 |
| 5,970,311 A | * | 10/1999 | Cheek et al. .................. 438/11 |
| 5,977,558 A | * | 11/1999 | Lee ................................ 257/48 |
| 6,001,663 A | * | 12/1999 | Ling et al. ..................... 438/17 |
| 6,165,807 A | * | 12/2000 | Lee et al. ...................... 438/18 |
| 6,403,482 B1 | * | 6/2002 | Rovedo et al. ............. 438/689 |

* cited by examiner

Primary Examiner—Steven Loke
Assistant Examiner—Quang Vu
(74) Attorney, Agent, or Firm—Winston Hsu

(57) ABSTRACT

A structure of a test key for monitoring self-aligned silicide (salicide) residues has of a silicon substrate, multiple parallel diffusion regions formed on the silicon substrate, multiple polysilicon lines formed on the silicon substrate, a dielectric layer covering the multiple polysilicon lines and the multiple diffusion regions, and multiple metallic test fingers formed on the dielectric layer. The multiple polysilicon lines are set across the multiple diffusion regions to form multiple contact regions, each contact region having an ion well, in the multiple diffusion regions, and each of the multiple metallic test fingers is orthogonal to the multiple polysilicon lines and electrically connected with each ion well via a contact plug.

14 Claims, 2 Drawing Sheets

STRUCTURE OF A TEST KEY FOR MONITORING SALICIDE RESIDUE

BACKGROUND OF THE INVENTION

1. Field of the Invention

The present invention relates to a structure of a test key for monitoring self-aligned silicide (salicide) residue, and more specifically, to a structure of a test key for sensitively detecting induced leakage current caused by salicide residue on a spacer of a polysilicon line during a wafer acceptance test (WAT).

2. Description of the Prior Art

In front-end-of-line (FEOL) manufacturing for semiconductor devices, a self-aligned silicide (salicide) process is one of the most normally applied processes for reducing a resistance of word lines and gates as well as for reducing a sheet resistance of a source/drain. Generally the salicide process comprises steps of: (1) globally depositing a metal layer, such as a cobalt (Co) layer or a titanium (Ti) layer; (2) performing a thermal process, normally a rapid thermal process (RTP), to make the previously formed metal layer selectively react with a silicon substrate or a polysilicon gate so as to form a silicide layer; and (3) performing a post-cleaning process to remove portions of the unreacted metal layer. A prior art method of fabricating a salicide layer and that of the post-cleaning process are respectively disclosed in U.S. Pat. Nos. 6,221,766 and 5,316,977 and are omitted in the following discussion for simplicity of description.

However, the cleaning process does not ensure that the surface of the semiconductor wafer is completely cleaned and is without salicide residue after the cleaning process. An incomplete process frequently leads to salicide residue, causing induced leakage current, which seriously reduces the electrical performance of the semiconductor device, on a wall of a spacer on either side of the word line. As the production line width is reduced to 0.15 microns with reduced spacing in a subwavelength semiconductor process, the induced leakage current caused by salicide residue becomes a serious and intolerable disadvantage that frequently leads to scrapped batches of the product. To precisely assess the post-cleaning efficiency of a salicide process, a wafer acceptance test (WAT) is frequently employed after the post-cleaning process.

The WAT method includes providing several test keys distributed in a periphery region of a die to be tested. The test keys typically are formed on a scribe line between dies, and are electrically coupled to an external terminal through a metal pad. A module of the test keys is selected and each test key from the selected module is respectively used for a test of different properties of the wafer, such as threshold voltage ($V_T$), saturation current ($ID_{SAT}$), gate oxide thickness or leakage current. A controlled bias is applied to the test keys, and the induced current is read out to detect defects on the wafer. The structure of the test key employed for detecting leakage current of a salicide layer after the post-cleaning process is shown in FIG. 1(*a*) and FIG. 1(*b*).

Please refer to FIG. 1(*a*) and FIG. 1(*b*), which respectively represent portions of the layout of the test key for detecting salicide residue in a diffusion region, and that for detecting salicide residue on the spacer on either side of the polysilicon lines. At least two test keys are used for detecting induced leakage current caused by salicide residue after the salicide process according to the prior art. As shown in FIG. 1(*a*), the test key for detecting salicide residue in the diffusion region comprises multiple first slim diffusion regions 12 arrayed along a first direction and multiple second slim diffusion regions 13 arrayed along a second direction, the first direction being anti-parallel to the second direction. Both the first slim diffusion regions 12 and second slim diffusion regions 13 are formed on a silicon substrate 10, and the first slim diffusion regions 12 are alternately arrayed with the second slim diffusion regions 13 so that adjacent first slim diffusion region 12 and second slim diffusion region 13, being isolated from each other by a shallow trench isolation (STI) region 14, are anti-parallel to each other. The multiple first slim diffusion regions 12 are electrically connected to a circuit A, and the multiple second slim diffusion regions 13 are electrically connected to a circuit B. Normally, the circuit A is connected to a read out circuit and provided with a bias voltage of 1.5 volts, and the circuit B is grounded. As adjacent first slim diffusion region 12 and second slim diffusion region 13 are connected with each other due to an increasingly accumulated salicide residue 16 on adjacent first slim diffusion region 12 and second slim diffusion region 13, a leakage current is detected.

As shown in FIG. 1(*b*), the test key for detecting salicide residue on the spacer on either side of the polysilicon lines comprises multiple first slim polysilicon lines 22 arrayed along a first direction and multiple second slim polysilicon lines 23 arrayed along a second direction, the first direction being anti-parallel to the second direction. Both the first slim polysilicon lines 22 and second slim polysilicon lines 23 are formed on a silicon substrate 20, and the first slim polysilicon lines 22 are alternately arrayed with the second slim polysilicon lines 23 so that adjacent first slim polysilicon line 22 and second slim polysilicon line 23, being isolated from each other by an STI region 24, are anti-parallel to each other. The multiple first slim polysilicon lines 22 are electrically connected to a circuit A, and the multiple second slim polysilicon lines 23 are electrically connected to a circuit B. Normally, the circuit A is connected to a read out circuit and provided with a bias voltage of 1.5 volts, and the circuit B is grounded. As adjacent first slim polysilicon line 22 and second slim polysilicon line 23 are connected with each other due to an increasingly accumulated salicide residue 26 on adjacent first slim polysilicon line 22 and second slim polysilicon line 23, a leakage current is detected.

However, the test key for detecting salicide residue according to the prior art is not sensitive. As described in preceding paragraphs, leakage current is only detected as adjacent first slim diffusion region 12 and second slim diffusion region 13, or adjacent first slim polysilicon line 22 and second slim polysilicon line 23, are connected to each other due to the increasingly accumulated salicide residue 16 or 26. Thus salicide residue merely on the first slim diffusion region 12, or the first slim polysilicon lines 22, is not detectable in this prior art method.

SUMMARY OF INVENTION

It is therefore a primary object of the present invention to provide a structure of a test key for sensitively detecting induced leakage current caused by self-aligned silicide (salicide) residue after a post-cleaning process of a salicide process.

It is another object of the present invention to provide a structure of a test key for detecting salicide residue on parallel slim diffusion regions or slim polysilicon lines.

According to the claimed invention, a structure of a test key for monitoring salicide residues comprises a silicon substrate, having at least a first diffusion region formed on the silicon substrate and at least a second diffusion region laterally formed on one side of the first diffusion region on the silicon substrate, a first polysilicon line and a second polysilicon line, each of the first and second polysilicon lines having two substantially vertical walls and a spacer formed on each of the two walls, formed on the silicon substrate across the first diffusion region and the second diffusion region, a dielectric layer covering the first polysilicon line, the second polysilicon line, the first diffusion region, and the second diffusion region, and a first metallic test finger and a second metallic test finger both orthogonal to the first polysilicon line and the second polysilicon line and both formed over the dielectric layer. A first contact region, comprising a first ion well, is formed in the first diffusion region between the first polysilicon line and the second polysilicon line, and a second contact region, comprising a second ion well, is formed in the second diffusion region between the first polysilicon line and the second polysilicon line. The first metallic test finger is electrically connected with the first ion well via first contact plug, and the second metallic test finger is electrically connected with the second ion well via a second contact plug.

It is an advantage of the present invention against the prior art that the test key is provided with a tri-layer structure, comprising the first and second diffusion regions, the first and second polysilicon lines, and the first and second metallic test fingers. Thus a test for detecting leakage current caused by salicide residue is performed after defining the first metallic conductive wires by respectively providing the first and second polysilicon lines with a bias voltage A and a bias voltage B, and respectively providing the first and second metallic test fingers with a bias voltage C and a bias voltage D. Therefore, the leakage current caused by salicide residue on the first and second diffusion regions is detected by the bias voltages A and B, and that caused by salicide residue on the first and second polysilicon lines is detected by the bias voltages C and D.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
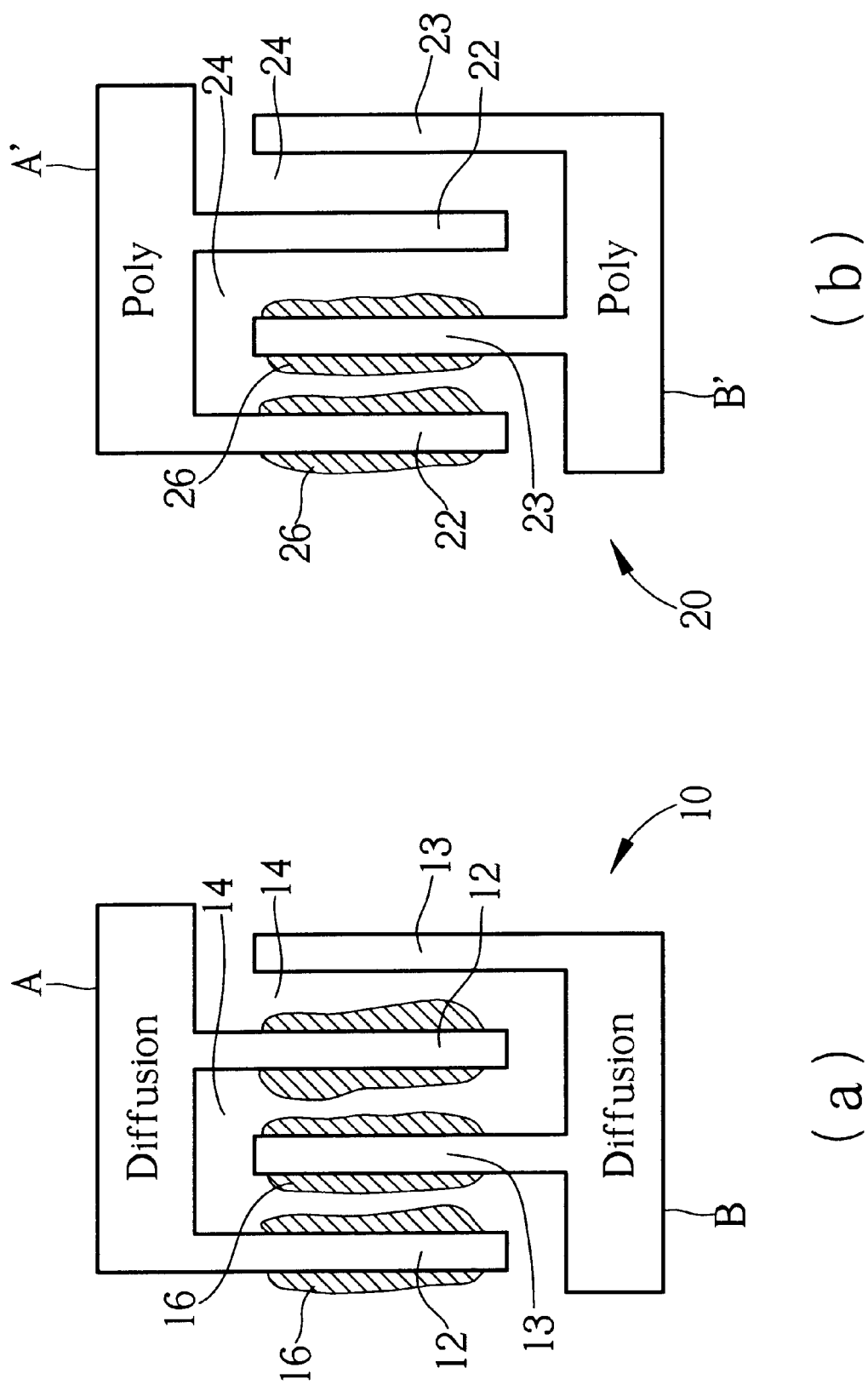
FIG. 1(a) represents portions of a layout of a test key for detecting salicide residue in a diffusion region according to the prior art.
FIG. 1(b) represents portions of a layout of a test key for detecting salicide residue on a spacer on either side of polysilicon lines according to the prior art.
Figure 2:
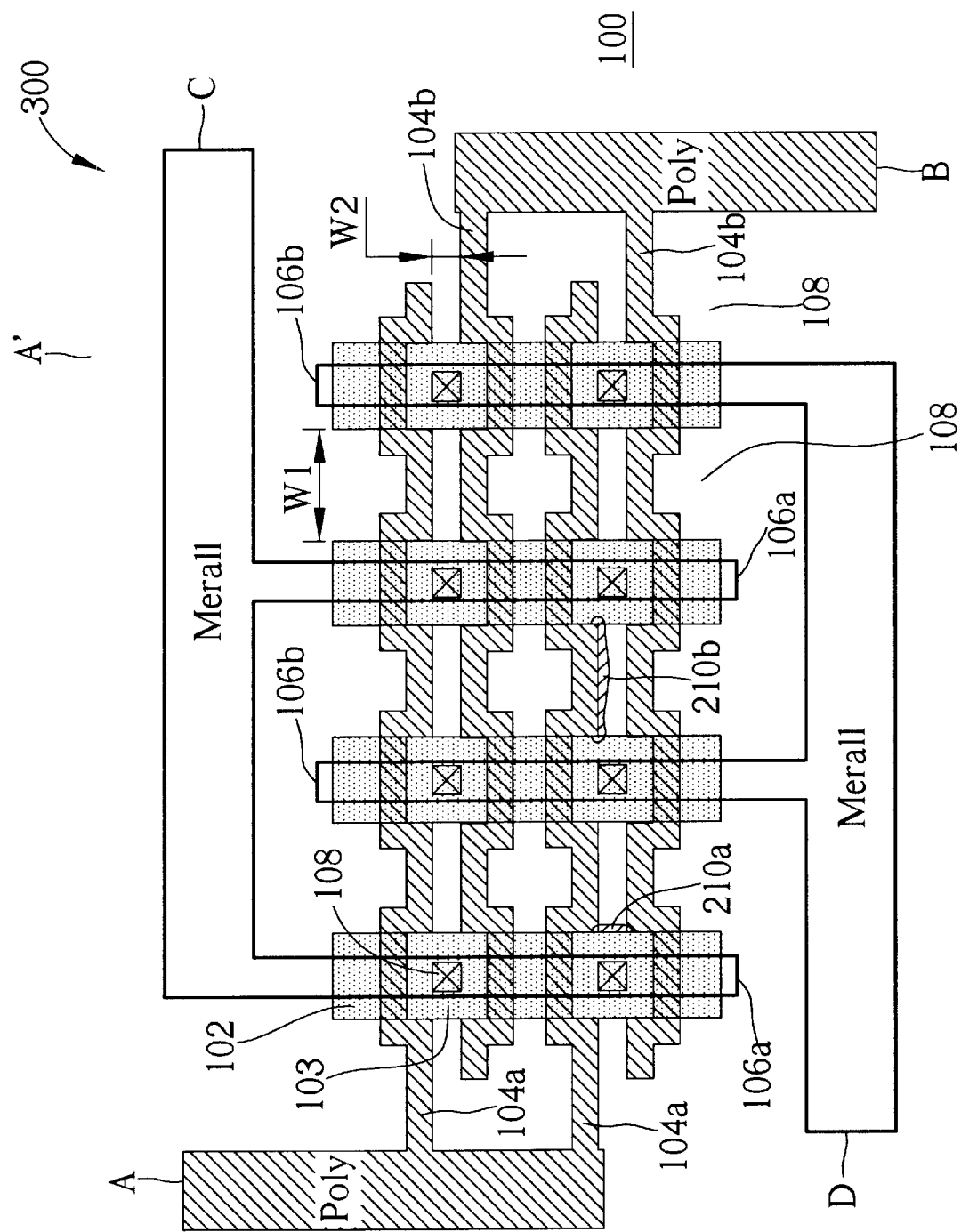
FIG. 2 represents portions of a layout of a test key for monitoring salicide residue according to the present invention.

Please refer to FIG. 2 of portions of a layout of a test key for monitoring self-aligned silicide (salicide) residue according to the present invention. As shown in FIG. 2, a structure of a test key 300 comprises a silicon substrate 100, having multiple diffusion regions 102 horizontally formed on the silicon substrate 100. Each set of adjacent diffusion regions 102 is isolated by a shallow trench isolation (STI) structure 108. Multiple polysilicon lines 104a and multiple polysilicon lines 104b are formed across the diffusion regions 102 and the STI structures 108. Since both the polysilicon lines 104a and polysilicon lines 104b have a square-waved layout, a contact region 103, comprising an ion well (not shown) in the silicon substrate 100, is formed in each diffusion region 102 between the first polysilicon line 104a and the second polysilicon line 104b. Each of the first and second polysilicon lines 104a and 104b has two substantially vertical walls, and a spacer (not shown), composed of silicon nitride, is formed on each of the two walls. In addition, a silicide layer (not shown) is formed on portions of the silicon substrate 100 within the contact region 103 as well as on both of the first and second polysilicon lines 104a and 104b.

In the preferred embodiment of the present invention, a distance $w_1$ between two neighboring diffusion regions 102 is approximately 0.2 microns, and a line width of the first polysilicon line 104a and second polysilicon line 104b is approximately 0.12 microns. In the square-waved shaped layouts of the first polysilicon lines 104a and second polysilicon lines 104b, the shortest distance $w_2$ between adjacent first polysilicon line 104a and second polysilicon line 104b is approximately 0.2 microns.

The structure of the test key 300 according to the present invention further comprises a dielectric layer (not shown) covering the first polysilicon lines 104a, the second polysilicon lines 104b, the diffusion regions 102 and the STI structures 108. The dielectric layer is generally composed of silicon oxide, BPSG, PSG or a low dielectric constant (low k) material, such as FSG, and is formed by a chemical vapor deposition (CVD) process after the salicide process. Salicide residues 210a and 210b, after a post-cleaning process of the salicide process, are thus covered by the dielectric layer. A first metallic test finger 106a and a second metallic test finger both being orthogonal to the first polysilicon line 104a and the second polysilicon line 104b, are formed on the dielectric layer and electrically connected with the ion well in the contact region 103 via a contact plug 108. Methods of forming the contact plug 108, the first metallic test finger 106a and the second metallic test finger 106b are not the primary objects of the present invention and are omitted for simplicity of description.

As described in preceding paragraphs, the test key 300 according to the present invention is a tri-layer structure comprising the diffusion region 102, the first and second polysilicon lines 104a and 104b, and the first and second metallic test fingers 106a and 106b. Thus, a test for detecting leakage current caused by salicide residue is performed after defining the first metallic conductive wires. During the test, the first and second polysilicon lines 104a and 104b are provided with a bias voltage A and a bias voltage B, respectively, and the first and second metallic test fingers 106a and 106b are provided with a bias voltage C and a bias voltage D, respectively. Normally, the first polysilicon line 104a is connected to a read out circuit and provided with a bias voltage of 1.5 volts, and the second polysilicon line 104b is grounded. As well, the first metallic test finger 106a is connected to another read out circuit and provided with a bias voltage of 1.5 volts, and the second metallic test finger 106b is grounded. Therefore, the leakage current caused by the salicide residue 210a is detected by the bias voltages A and B, and that caused by the salicide residue 210b is detected by the bias voltages C and D.

In Comparison with the structure of the test key according to the prior art, the test key 300 comprises a tri-layers structure so as to sensitively detect the leakage current caused by the salicide residues 210a and 210b. The post-cleaning efficiency of a salicide process is therefore assessed precisely.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A test key array, comprising:

a silicon substrate;

columns of diffusion regions formed on the silicon substrate in a parallel manner;

rows of polysilicon lines formed across the diffusion regions, wherein the polysilicon lines create a plurality of contact regions in the diffusion regions;

a dielectric layer covering the polysilicon lines and the diffusion regions; and columns of metallic fingers formed over the dielectric layer, each of the metallic fingers being electrically connected to one of the contact regions via a contact plug.

2. The test key array of claim 1 wherein each of the polysilicon lines has two substantially vertical walls, and a spacer is formed on each of the two walls.

3. The test key array of claim 2 wherein the spacer is composed of silicon nitride.

4. The test key array of claim 1 further comprising a silicide layer formed over the silicon substrate within each of the contact regions.

5. The test key array of claim 1 wherein the test key array is formed over a scribe line of a wafer.

6. The test key array of claim 1 wherein the diffusion regions are isolated by a shallow trench isolation (STI) region.

7. The test key array of claim 1 wherein the metallic test fingers are orthogonal to the polysilicon lines.

8. A structure of a test key for monitoring self-aligned silicide (salicide) residues, the structure comprising:

a silicon substrate;

a first diffusion region formed on the silicon substrate;

a second diffusion region laterally formed on one side of the first diffusion region of the silicon substrate;

a first polysilicon line and a second polysilicon line formed on the silicon substrate across the first diffusion region and the second diffusion region, wherein a first contact region is formed in the first diffusion region between the first polysilicon line and the second polysilicon line, and a second contact region is formed in the second diffusion region between the first polysilicon line and the second polysilicon line;

a dielectric layer covering the first polysilicon line, the second polysilicon line, the first diffusion region, and the second diffusion region; and a first metallic test finger and a second metallic test finger both orthogonal to the first polysilicon line and the second polysilicon line and both formed over the dielectric layer, wherein the first metallic test finger is electrically connected to the first contact region via a first contact plug, and the second metallic test finger is electrically connected to the second contact region via a second contact plug.

9. The test key of claim 8 wherein each of the first and second polysilicon lines has two substantially vertical walls, and a spacer is formed on each of the two walls.

10. The test key of claim 9 wherein the spacer is composed of silicon nitride.

11. The test key of claim 8 further comprising a suicide layer formed over the silicon substrate within the first contact region and the second contact region.

12. The test key of claim 8 wherein the test key is formed over a scribe line of a wafer.

13. The test key of claim 8 wherein the first diffusion region and the second diffusion region are isolated by a shallow trench isolation (STI) region.

14. The test key of claim 8 wherein the first metallic test finger and the second metallic test finger are electrically connected with a test circuit that is used to measure a leakage current created by salicide residues.

* * * * *